United States Patent
Kwon et al.

(10) Patent No.: US 9,625,531 B2
(45) Date of Patent: Apr. 18, 2017

(54) APPARATUS AND METHOD FOR CALCULATING PRECHARGE RESISTANCE OF BATTERY PACK

(71) Applicant: LG CHEM, LTD., Seoul (KR)

(72) Inventors: Jae Sung Kwon, Daejeon (KR); Jin Hwee Choi, Daejeon (KR)

(73) Assignee: LG CHEM, LTD., Seoul (KR)

( * ) Notice: Subject to any disclaimer, the term of this patent is extended or adjusted under 35 U.S.C. 154(b) by 489 days.

(21) Appl. No.: 14/378,549

(22) PCT Filed: Feb. 5, 2014

(86) PCT No.: PCT/KR2014/000990
§ 371 (c)(1),
(2) Date: Aug. 13, 2014

(87) PCT Pub. No.: WO2015/034144
PCT Pub. Date: Mar. 12, 2015

(65) Prior Publication Data
US 2015/0346283 A1    Dec. 3, 2015

(30) Foreign Application Priority Data
Sep. 5, 2013   (KR) .................. 10-2013-0106766

(51) Int. Cl.
*G01R 27/08* (2006.01)
*G01R 31/36* (2006.01)
(Continued)

(52) U.S. Cl.
CPC ...... *G01R 31/3648* (2013.01); *B60L 11/1809* (2013.01); *B60L 11/1851* (2013.01);
(Continued)

(58) Field of Classification Search
CPC combination set(s) only.
See application file for complete search history.

(56) References Cited

U.S. PATENT DOCUMENTS 8,564,156 B2 * 10/2013 Kang .................. B60L 11/1805
307/115
2004/0080330 A1   4/2004 Kunikiyo
(Continued)

FOREIGN PATENT DOCUMENTS

EP   1 972 955 A1   9/2008
JP   60-98072 U    7/1985
(Continued)

OTHER PUBLICATIONS

Computer-generated translation of JP 2009-229405, published on Oct. 2009.*

(Continued)

*Primary Examiner* — Huan Tran
(74) *Attorney, Agent, or Firm* — Birch, Stewart, Kolasch & Birch, LLP

(57) ABSTRACT

Disclosed are an apparatus and a method for calculating a precharge resistance of a battery pack. The apparatus for calculating a precharge resistance of a battery pack according to the present invention includes: a load resistor configured to be connected between a battery pack and a precharge resistor in series; a voltage measuring unit configured to measure a no-load voltage in a no-load state in which the load resistor is not installed in the battery pack or a load voltage applied to the load resistor when the load resistor has a predetermined current value in a load state in which the load resistor is installed in the battery pack; and a precharge resistance calculating unit configured to calculate the precharge resistor of the battery pack using the no-load voltage of the battery pack, the load voltage, and the predetermined current value.

20 Claims, 5 Drawing Sheets

(51) Int. Cl.
*B60L 11/18* (2006.01)
*H01M 10/42* (2006.01)
*H01M 10/48* (2006.01)

(52) U.S. Cl.
CPC ......... *G01R 27/08* (2013.01); *G01R 31/3662* (2013.01); *H01M 10/425* (2013.01); *H01M 10/48* (2013.01); *B60L 2240/547* (2013.01); *B60L 2240/549* (2013.01); *B60L 2260/44* (2013.01); *G01R 31/3627* (2013.01); *Y02T 10/7005* (2013.01); *Y02T 10/705* (2013.01); *Y02T 10/7072* (2013.01); *Y02T 90/14* (2013.01)

(56) References Cited

U.S. PATENT DOCUMENTS

| | | |
|---|---|---|
| 2007/0170931 A1 | 7/2007 | Snyder |
| 2010/0133914 A1 | 6/2010 | Kang et al. |
| 2011/0037475 A1 | 2/2011 | Ho |
| 2013/0038340 A1 | 2/2013 | Masuda |

FOREIGN PATENT DOCUMENTS

| | | |
|---|---|---|
| JP | 5-249158 A | 9/1993 |
| JP | 2009-229405 A | 10/2009 |
| JP | 2012-501620 A | 1/2012 |
| KR | 10-2012-0139795 A | 12/2012 |

OTHER PUBLICATIONS

Korean Office Action for Appl. No. 10-2013-0106766 dated Aug. 31, 2015 (w/ English translation).
Japanese Office Action dated Nov. 4, 2015 for Appl. No. 2015-535590 (w/ English translation).
European Office Action for Appl. No. 14747792.1 dated Apr. 18, 2016.
Japanese Office Action dated Aug. 2, 2016 for Appl. No. 2015-535590 (w/ English translation).
European Search Report for Appl. No. 14747792.1 dated Aug. 14, 2015.
Korean Office Action for Appl. No. 10-2013-0106766 dated Feb. 27, 2015 (w/ English translation).
Written Opinion of the International Searching Authority for PCT/KR2014/000990 mailed on Jun. 10, 2014.

\* cited by examiner

APPARATUS AND METHOD FOR CALCULATING PRECHARGE RESISTANCE OF BATTERY PACK

CROSS REFERENCE TO RELATED APPLICATIONS

This application is the National Phase of PCT International Application No. PCT/KR2014/000990, filed on Feb. 5, 2014, which claims priority under 35 U.S.C. 119(a) to Patent Application No. 10-2013-0106766, filed in the Republic of Korea on Sep. 5, 2013, all of which are hereby expressly incorporated by reference into the present application.

TECHNICAL FIELD

The present invention relates to an apparatus and a method for calculating a precharge resistance of a battery pack, and more particularly, to an apparatus and a method for calculating a precharge resistance of a battery pack, in which a no-load voltage in a no-load state in which by measuring a load resistor is not equipped in the battery pack, and a load voltage applied to the load resistor when the load resistor is equipped and a current having a predetermined current value flows in the load resistor, and calculating a precharge resistance value of the battery pack using the measured value and the predetermined current value, a resistance value is calculated using a discharge without separately decomposing the precharge resistor which is equipped in the battery pack, so as to confirm a current state of the battery and determine abnormality of the precharge resistance, thereby making it possible to diagnose failure in the battery.

BACKGROUND ART

A secondary battery having easy applicability depending on a product group and electrical characteristics such as high energy density has been generally applied to an electric vehicle (EV) and a hybrid vehicle (HV) which are driven by an electrical driving source, an energy storage system (ESS) or an uninterruptible power supply (UPS) system which uses a medium-large size battery used for a household or industrial purpose, and the like, as well as portable devices.

The secondary battery may surprisingly reduce the use of fossil fuel and does not generate by-products due to the use of energy at all and therefore has received attention as a new energy source for enhancing environmentally-friendly characteristics and energy efficiency.

When the secondary battery is implemented as a battery for a portable terminal, and the like, the secondary battery may not necessarily be like that, but the battery applied to the electric vehicle or the energy storage source as described above is generally used in a form in which a plurality of unit secondary cells is collected and thus has high suitability for high-capacity environment.

When the battery, in particular, a plurality of secondary batteries repeatedly carries out charging and discharging, it is necessary to manage the batter by efficiently controlling the charging and discharging of the battery so as to appropriately maintain the operation state and performance of the battery.

To this end, a battery management system (BMS) to manage the state and performance of the battery is provided. The BMS serves to detect the current, voltage, temperature, and the like of the battery, calculate a state of charge (SOC), equalize a cell voltage, and control a high voltage relay based on the detected current, voltage, temperature, and the like, and a high voltage relay apparatus is configured to include a current detection apparatus of the battery pack and a high voltage relay, and the current detection apparatus detects a charging and discharge current amount, transfers a value of the detected current amount to the BMS, and receives a control signal from the BMS to drive the relay.

In particular, when a normal charging current is introduced into the battery of which the voltage excessively drops at the time of the initial charging and discharging, the battery abnormally generates heat and thus a spark is generated, thereby causing damage to a switch. Therefore, it is important to drive a precharge relay switch to control the battery voltage until the battery voltage rises to some degree when a voltage conversion apparatus is connected to the battery.

Therefore, it is an essential factor to calculate the resistance value of the precharge resistor included in a precharge relay switch line in order to control the relay switch. However, according to the related art, when the precharge resistance is not specified or is unknown, the precharge resistance needs to be measured by separately disassembling the battery pack, and therefore a lot of cost and time are required, thereby causing reduction in convenience or efficiency.

DETAILED DESCRIPTION OF THE INVENTION

Technical Problem

The present invention has been made in an effort to provide an apparatus and a method for calculating a precharge resistance of a battery pack, in which a no-load voltage in a no-load state in which a load resistance is not equipped in the battery pack and a load voltage applied to the load resistor when the load resistor is equipped and a current having a predetermined current value flows in the load resistor are measured and a precharge resistance value of the battery pack is calculated using the measured value and the predetermined current value and a resistance value is calculated using a discharge without separately decomposing the precharge resistor which is equipped in the battery pack to confirm a current state of the battery and determine abnormality of the precharge resistance, thereby providing a fault diagnosis of the battery.

Technical Solution

An exemplary embodiment of the present invention provides an apparatus for calculating a precharge resistance of a battery pack, including: a load resistor connected between a battery pack and a precharge resistor in series; a voltage measuring unit configured to measure a no-load voltage in a no-load state in which the load resistor is not installed in the battery pack or a load voltage applied to the load resistor when a current having a predetermined current value flows in the load resistor in a load state in which the load resistor is installed in the battery pack; and a precharge resistance calculating unit configured to calculate the precharge resistor of the battery pack using the no-load voltage of the battery pack, the load voltage of the load resistor, and the predetermined current value.

The no-load voltage may be an open circuit voltage (OCV) of the battery pack.

The load resistor may be a variable resistor which controls a resistance value to adjust a current value of the current flowing in the load resistor.

The precharge resistance calculating unit may gradually increase the resistance value of the load resistor from 0 ohm in the load state to control the current flowing in the load resistor to have the predetermined current value.

The predetermined current value may be 1 A.

The apparatus for calculating a precharge resistance of a battery pack may further include: a current measuring unit disposed between the battery pack and the load resistor or between the load resistor and the precharge resistor and configured to measure a current.

The current measuring unit may be a current sensor.

The apparatus for calculating a precharge resistance of a battery pack may further include: a switch control unit connected to the battery pack in series and configured to control a switch performing an opening and closing operation of a line provided with the precharge resistor.

The switch control unit may perform an operation of closing the switch so as to measure the no-load voltage or the load voltage in the no-load state or the load state.

The switch may be a precharge relay switch.

The precharge resistance calculating unit may calculate the resistance value of the precharge resistor based on the following Equation.

$$Rp=(V\_1-V\_2)/A \qquad [\text{Equation}]$$

Herein, Rp represents the precharge resistance, V_1 represents the no-load voltage, V_2 represents the load voltage, and A represents the predetermined current value.

Another exemplary embodiment of the present invention provides a method for calculating a precharge resistance of a battery pack, including: measuring a no-load voltage in a no-load state in which the load resistor is not installed in the battery pack or a load voltage applied to the load resistor when a current having a predetermined current value flows in the load resistor in a load state in which the load resistor is installed in the battery pack; and calculating a resistance value of the precharge resistor of the battery pack using the no-load value of the battery pack, the load voltage, and the predetermined.

The no-load voltage may be an open circuit voltage (OCV) of the battery pack.

The method for calculating a precharge resistance of a battery pack may further include: controlling a resistance value to adjust a current value of the current flowing in the load resistor.

In the calculating, the resistance value of the load resistor may be gradually increased from 0 ohm in the load state to control the current flowing in the load resistor to have the predetermined current value.

The predetermined current value may be 1 A.

The method for calculating a precharge resistance of a battery pack may further include: measuring a current between the battery pack and the load resistor or between the load resistor and the precharge resistor.

The method for calculating a precharge resistance of a battery pack may further include: controlling a switch which is connected to the battery pack in series and performs an opening and closing operation of a line provided with the precharge resistor.

In the controlling of the switch, an operation of closing the switch may be performed so as to measure the no-load voltage or the load voltage in the no-load state or the load state of the battery pack.

In the calculating, the resistance value of the precharge resistance may be calculated based on the following Equation.

$$Rp=(V\_1-V\_2)/A \qquad [\text{Equation}]$$

Herein, Rp represents the precharge resistance, V_1 represents the no-load voltage of the battery pack, V_2 represents the load voltage applied to the load resistor, and A represents the predetermined current value.

Advantageous Effects

According to the exemplary embodiment of the present invention, it is possible to provide the apparatus and method for calculating a precharge resistance of a battery pack, in which by measuring the no-load voltage in the no-load state in which the load resistor is not equipped in the battery pack, and the load voltage applied to the load resistor when the load resistor is equipped and the current having the predetermined current value flows in the load resistor, and calculating the precharge resistance value of the battery pack using the measured value and the predetermined current value, the resistance value is calculated using the discharge without separately decomposing the precharge resistor, which is equipped in the battery pack, so as to confirm the current state of the battery and determine the abnormality of the precharge resistance, thereby making it possible to diagnose failure in the battery.

BEST MODE

Figure 1:
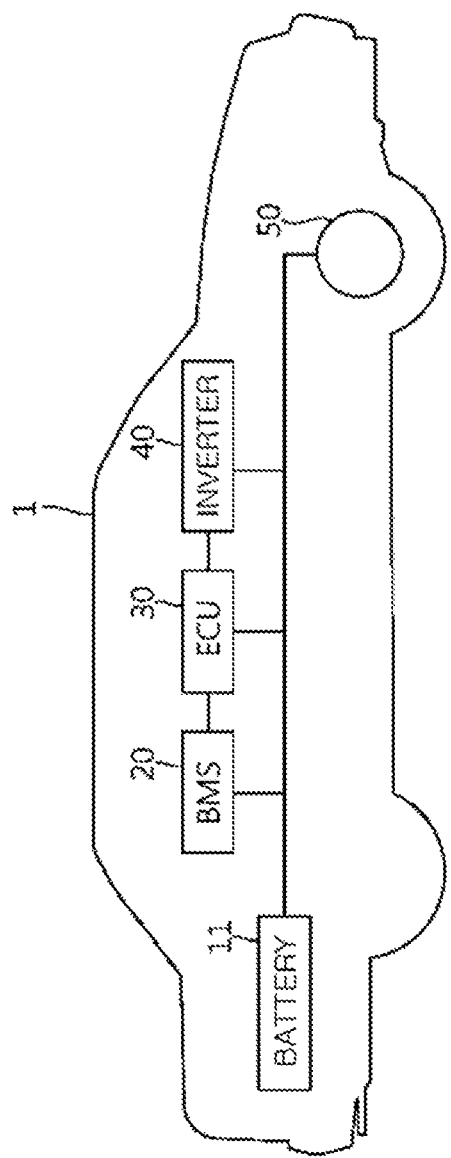
FIG. 1 is a diagram schematically illustrating an electric vehicle to which an apparatus for calculating a precharge resistance of a battery pack according to an exemplary embodiment of the present invention may be applied.

Hereinafter, the present invention will be described in detail with reference to the accompanying drawings. The repeated descriptions and detailed descriptions related to publicly known functions or configurations, which may unnecessarily obscure the subject matter of the present invention, will be omitted herein. Exemplary embodiments of the present invention are provided to fully convey the concept of the invention to those skilled in the art. Therefore, in the drawings, shapes, dimensions, etc. of components may be exaggerated for clarity.

Throughout the present specification, unless otherwise described, "comprising" any components will be understood to imply the inclusion of another element rather than the exclusion of another element.

A term "unit" described in the specification means a unit of processing at least one function or operation and may be implemented by hardware or software or a combination of hardware and software.

FIG. 1 is a diagram schematically illustrating an electric vehicle to which an apparatus for calculating a precharge resistance of a battery pack according to an exemplary embodiment of the present invention may be applied.

FIG. 1 illustrates an example in which the apparatus for calculating a precharge resistance of a battery pack according to the exemplary embodiment of the present invention is applied to the electric vehicle, but it is possible to apply the apparatus for calculating a precharge resistance of a battery pack according to the exemplary embodiment of the present invention to any technical field to which the secondary battery may be applied, such as an energy storage system (ESS) or an uninterruptible power supply (UPS) system for a household or industrial purpose, in addition to the electric vehicle.

An electric vehicle 1 may be configured to include a battery 11, a battery management system (BMS) 20, an electronic control unit (ECU) 30, an inverter 40, and a motor 50.

The battery 11 is an electric energy source which supplies a driving force to the motor 50 to drive the electric vehicle 1. The battery 11 may be charged or discharged by the inverter 40 according to a driving of the motor 50 and/or an internal combustion engine (not illustrated).

Herein, a kind of the battery 11 is not particularly limited, and examples of the battery 11 may include a lithium ion battery, a lithium polymer battery, a nickel cadmium battery, a nickel hydrogen battery, a nickel zinc battery, and the like.

Further, the battery 11 is formed of a battery pack in which a plurality of battery cells is connected in serial and/or parallel. Further, the battery 11 may also be formed to include at least one battery pack.

The BMS 20 estimates a state of the battery 11 and uses the estimated state information to manage the battery 11. For example, the BMS 20 estimates and manages the state information of the battery 11 such as a state of charging (SOC), a state of health (SOH), a maximum input/output power allowable quantity, and an output voltage of the battery 11. Further, the charging or the discharging of the battery 11 may be controlled and a replacement time of the battery 11 may also be estimated by using the state information.

Further, the BMS 20 according to the exemplary embodiment of the present invention may include an apparatus 100 (FIG. 3) for calculating a precharge resistance of a battery pack. The accuracy and reliability on whether the precharge state of the battery pack is present or a voltage amount or a charging and discharging voltage state applied to the precharge resistance may be improved by the apparatus 100 (FIG. 3) for calculating a precharge resistance of a battery pack.

The ECU 30 is an electronic control apparatus which controls a state of the electric vehicle 1. For example, the ECU 30 determines a torque level based on information of an accelerator, a brake, a speed, and the like and controls an output from the motor 50 to match the torque information.

Further, the ECU 30 transmits a control signal to the inverter 40 so that the battery 11 may be charged or discharged based on the state information such as the SOC and the SOH of the battery 11 which are transmitted from the BMS 20.

The inverter 40 charges or discharges the battery 11 based on the control signal from the ECU 30.

The motor 50 drives the electric vehicle 1 using the electric energy of the battery 11 based on the control information (for example, torque information) transmitted from the ECU 30.

The electric vehicle 1 is driven by using the electric energy of the battery 11, and therefore it is important to accurately estimate the state (for example, precharge voltage or precharge resistance value) of the battery 11.

Figure 2:
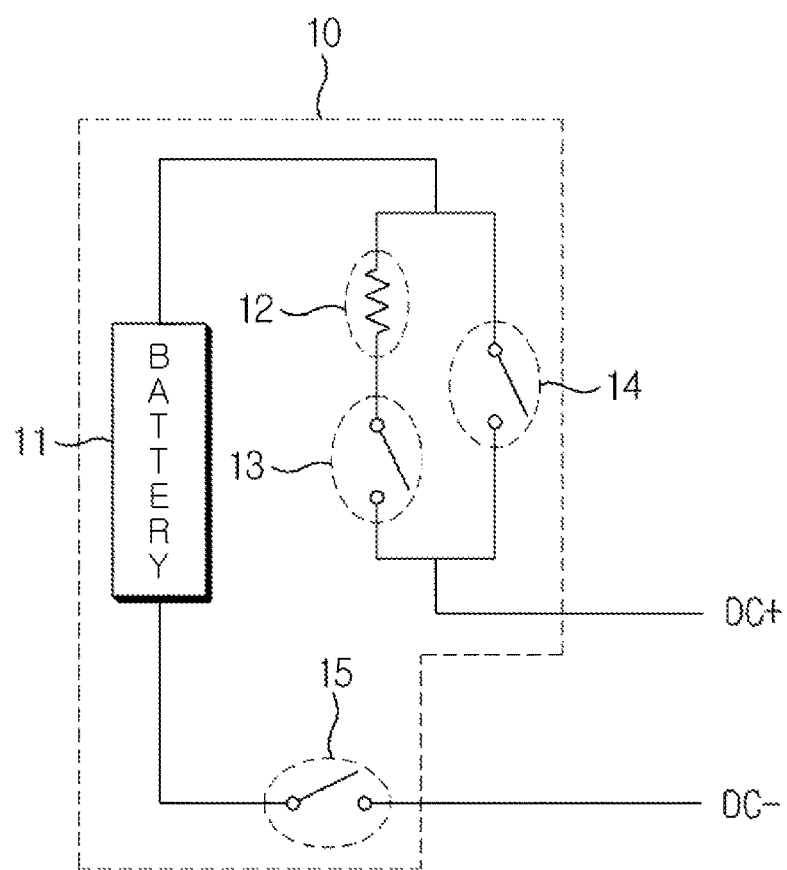
FIG. 2 is a diagram for describing a relay control system to which the apparatus for calculating a precharge resistance of a battery pack according to the exemplary embodiment of the present invention may be applied.

FIG. 2 is a diagram for describing a relay control system to which the apparatus for calculating a precharge resistance of a battery pack according to the exemplary embodiment of the present invention may be applied.

Referring to FIG. 2, the apparatus for calculating a precharge resistance of a battery pack may be configured to include an inverter (not illustrated) which converts an AC current, which is generated in a motor (not illustrated) or a generator (not illustrated), into a DC current and transfers the converted current to the battery 11, and a relay control system which connects the battery 11 with the inverter (not illustrated). FIG. 2, which is a diagram for describing the relay control system to which the apparatus for calculating a precharge resistance of a battery pack may be applied, is based on an exemplary embodiment, and the components of the relay control system are not limited to the exemplary embodiment illustrated in FIG. 2, and some of the components may be added, changed, or deleted, if necessary.

The relay control system may include a main positive relay switch 14 which transfers the current, which is output from the battery 11, to the motor (not illustrated) or the generator (not illustrated) and is installed at a positive (+) power line, a main negative relay switch 15 which connects the battery 11 with the inverter (not illustrated) and is installed at a negative (−) power line, a precharge relay switch 13 which is connected to the main positive relay switch 14 in parallel, and a precharge resistor 12 which is connected to a line of the precharge relay switch 13.

The main positive relay switch 14 and the main negative relay switch 15 may be connected to a power supply at the time of charging and discharging.

When the main positive relay switch 14 and the main negative relay switch 15 are directly connected to the battery 11, the precharge relay switch 13 is applied with a high current at a time, such that the main positive relay switch 14 may abnormally generate heat or may be damaged. Therefore, the precharge relay switch 13 is first applied with a low current before the main positive relay switch 14 is closed, thereby preventing the main positive relay switch 14 from abnormally generating heat or being damaged.

At the time of connection, the relay control system first closes the main negative relay switch 15 which starts initial charging and discharging, and then closes the precharge relay switch 13 according to a preset program, thereby inducing the low current prior to performing fast charging and charging. Then, the relay control system closes the main relay positive switch 14 and then opens the precharge relay switch 13, thereby performing the fast charging and discharging.

Figure 3:
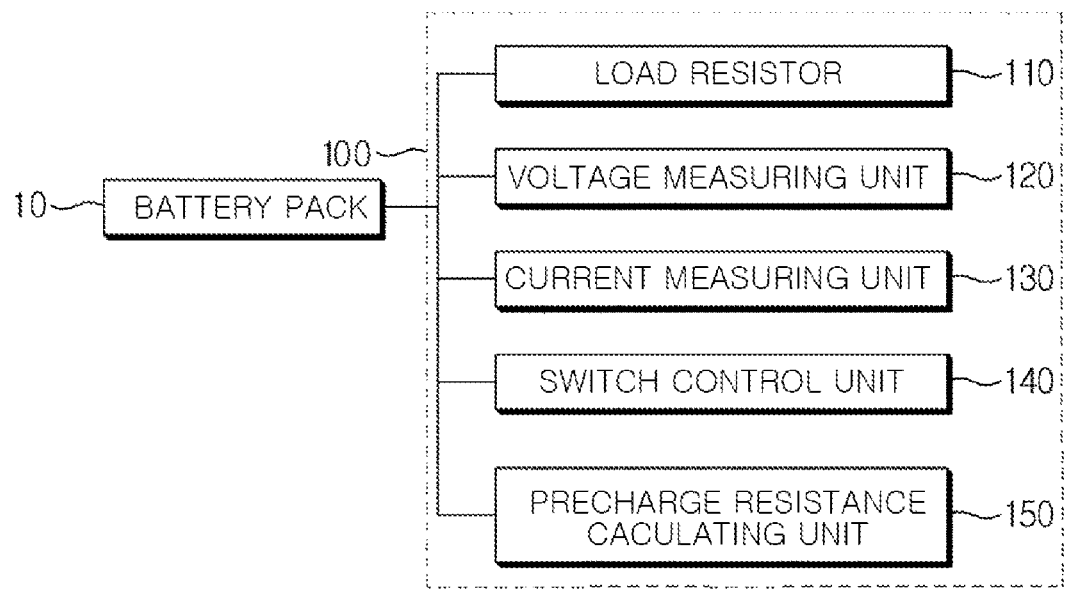
FIG. 3 is a diagram schematically illustrating the apparatus for calculating a precharge resistance of a battery pack according to the exemplary embodiment of the present invention.

FIG. 3 is a diagram schematically illustrating the apparatus for calculating a precharge resistance of a battery pack according to the exemplary embodiment of the present invention.

Referring to FIG. 3, the apparatus 100 for calculating a precharge resistance of a battery pack according to the exemplary embodiment of the present invention may be configured to include a load resistor 110, a voltage measuring unit 120, a current measuring unit 130, a switch control unit 140, and a precharge resistance calculating unit 150. The apparatus 100 for calculating a precharge resistance of a battery pack, which is illustrated in FIG. 3, is based on an exemplary embodiment, and the components thereof are not limited to the exemplary embodiment illustrated in FIG. 3 and some of the components may be added, changed, or deleted, if necessary.

The load resistor 110 is connected between a battery pack 10 and the precharge resistor 12 in series.

According to the exemplary embodiment of the present invention, the load resistor 110 may be a variable resistor which may control a resistance value to adjust a current value of a current flowing in the load resistor 110. For example, the load resistor 110 may be configured to include at least one of a one-rotation type variable resistor, a semi-fixed variable resistor, and a direct drive type variable resistor.

The voltage measuring unit 120 may measure a no-load voltage in a no-load state in which the load resistor 110 is not installed in the battery pack 10 or a load voltage applied to the load resistor 110 when a current having a predetermined current value flows in the load resistor 110 in the load state in which the load resistor 110 is installed in the battery pack 10.

The predetermined current value may be an initially set value or a value set by a user, as necessary, so that the predetermined current value may satisfy a low current range in which the switch is not damaged, in consideration of the fact that the precharge relay switch 13 is driven in the low current state in the beginning of the charging and discharging of the battery pack 10 as described with reference to FIG. 2. For example, the predetermined current value may be 1 A.

The current measuring unit 130 is disposed between the battery pack 10 and the load resistor 110 or between the load resistor 110 and the precharge resistor 12 to measure a current. The current measuring unit 130 measures the current flowing in the load resistor 110 to confirm whether the current value of the current flowing in the load resistor 110 becomes the predetermined current value. According to the exemplary embodiment of the present invention, the current measuring unit 130 may be a current sensor. For example, the current measuring unit 130 may be configured to include at least one of a current transformer type current sensor, a hall element type current sensor, and a fuse type current sensor.

Hereinafter, the case in which the apparatus for calculating precharge resistance of a battery pack according to the exemplary embodiment of the present invention is in the no-load state to obtain the no-load voltage and a load state to obtain the load voltage will be described with reference to FIGS. 4 to 5.

Figure 4:
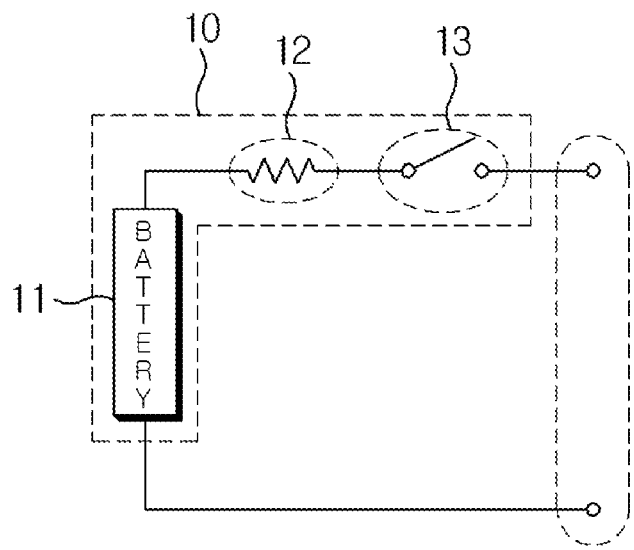
FIG. 4 is a diagram illustrating an example in which the apparatus for calculating a precharge resistance of a battery pack according to the exemplary embodiment of the present invention is in a no-load state to obtain a no-load voltage.
Figure 5:
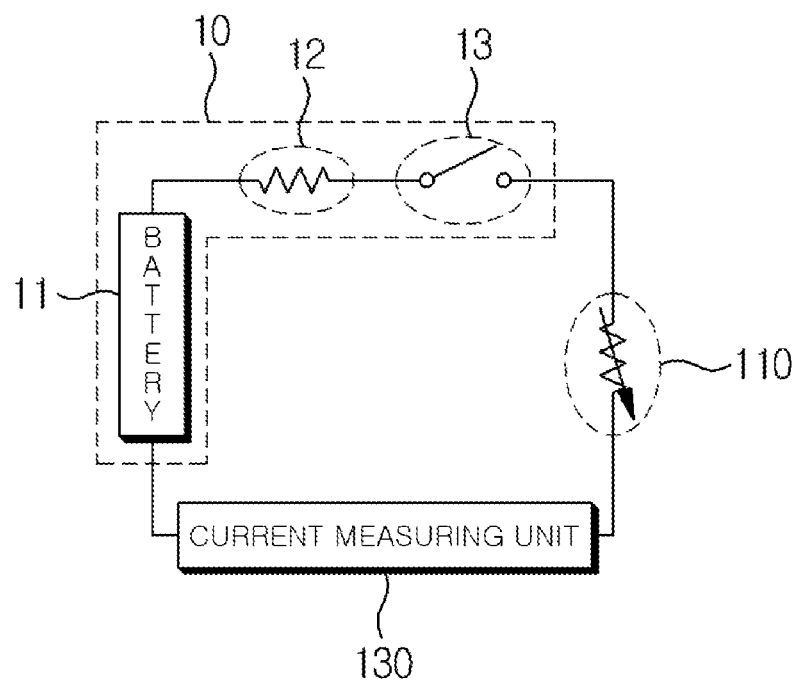
FIG. 5 is a diagram illustrating an example in which the apparatus for calculating a precharge resistance of a battery pack according to the exemplary embodiment of the present invention is in a load state to obtain a load voltage.

FIG. 4 is a diagram illustrating an example in which the apparatus for calculating a precharge resistance of a battery pack according to the exemplary embodiment of the present invention is in a no-load state to obtain a no-load voltage.

First, the switch control unit 140 performs an operation of opening and closing the precharge relay switch 13 to make the no-load voltage in the no-load state be measured.

The no-load voltage may be an open circuit voltage (OCV) of the battery pack 10. The no-load voltage means a voltage in which a voltage drop due to the resistor in the battery 11 is subtracted from the output voltage of the battery 11 and an effect of the current from the battery 11 at that time is excluded. A current voltage of the battery 11 may be figured out by measuring the no-load voltage, and thus may be used to calculate a voltage applied to the precharge resistor 12 later. FIG. 5 is a diagram illustrating an example in which the apparatus for calculating a precharge resistance of a battery pack according to the exemplary embodiment of the present invention is in a load state to obtain a load voltage.

First, the switch control unit 140 performs an operation of opening and closing the precharge relay switch 13 to make the load voltage in the load state be measured.

According to the exemplary embodiment of the present invention, when the apparatus for calculating a precharge resistance of a battery pack is in the load state, the load resistor 110 may be connected to the battery pack 10 in series. In this case, the resistance value of the load resistor 110 may be controlled so that the current value of the current flowing in the load resistor 110 becomes the predetermined current value. According to the exemplary embodiment of the present invention, the resistance value of the load resistor 110 may be gradually increased from 0 ohm until the current value of the current flowing in the load resistance 110 becomes the predetermined current value.

In this case, the current measuring unit 130 measures the current flowing in the load resistor 110 to confirm whether the current value of the current flowing in the load resistor 110 becomes the predetermined current value. FIG. 5 illustrates that the current measuring unit 130 is disposed between the battery 11 and the load resistor 110, but the current measuring unit 130 may also be disposed between the load resistor 110 and the precharge relay switch 13.

When the current value of the current flowing in the load resistor 110 becomes the predetermined current value, the voltage measuring unit 120 measures the voltage applied to the load resistor 110 to measure the load voltage.

In other words, the precharge resistance calculating unit 150 gradually increases the resistance value of the load resistor 110 from 0 ohm to control the current flowing in the load resistor 110 to become the predetermined current value. For example, when the resistance value of the load resistor 110 is increased from a low value, a total resistance value of a line, which is a sum of the load resistor 110 and the precharge resistor 12 that are connected in series, is gradually increased and the total voltage on the line is constant, such that the applied current is reduced in inverse proportion in the total resistance value of a line. Therefore, a current value is controlled with a low current value (for example, 1 A) at which the precharge relay switch 13 is originally driven and then the voltage applied to the load resistor 110 is measured when the current value is the predetermined current value, such that it is possible to find the voltage applied to the precharge resistor 12 by using the fact that the measured voltage is the no-load voltage measured in FIG. 4, that is, the voltage that is divided into the voltage applied to the load resistor 110 and the voltage applied to the precharge resistor 12 from the current voltage of the battery 11.

The switch control unit 140 is connected to the battery pack 10 in series to control a switch which performs the opening and closing operation of the line in which the precharge resistor 12 of the battery pack 10 is provided. According to the exemplary embodiment of the present invention, as described with reference to FIGS. 4 and 5, the switch control unit 140 may perform an operation of closing the switch so as to measure the no-load voltage or the load voltage in the no-load state or the load state. In this case, the switch may be the precharge relay switch 13.

The precharge resistance calculating unit 150 may calculate the resistance value of the precharge resistor 12 based on the following Equation 1.

$$Rp=(V\_1-V\_2)/A \qquad \text{[Equation 1]}$$

Herein, Rp represents the precharge resistance, V_1 represents the no-load voltage, V_2 represents the load voltage, and A represents the predetermined current value.

In this case, V_1 is a value measured by the voltage measuring unit 120 using the open circuit voltage in the no-load state of the battery pack 10. That is, V_1 is the no-load voltage measured in the no-load state of FIG. 4. Further, V_2 is a value measured by the voltage measure unit 120 in the load state of the load resistor 110. That is, V_2 is the load voltage measured in the load state of FIG. 5. Further, the predetermined current value is a value measured by the current measuring unit 130.

In Equation 1, Rp has a unit of ohm (Ω), V_1 and V_2 have a unit of volt (V), and A has a unit of ampere (A).

In Equation 1, it is possible to use the fact that a difference between the no-load voltage of the battery pack and the load voltage applied to the load resistor 110 in the load state is the same as the voltage applied to the precharge resistor 12.

Since the predetermined current value which is constantly adjusted in the load resistor 110 is measured, the same current on a serial line may also flow in the precharge resistor 12.

The resistance value of the precharge resistor 12 may be obtained by dividing a voltage by a current using the calculated voltage and current applied to the precharge resistor 12 and using an ohm's law.

Figure 6:
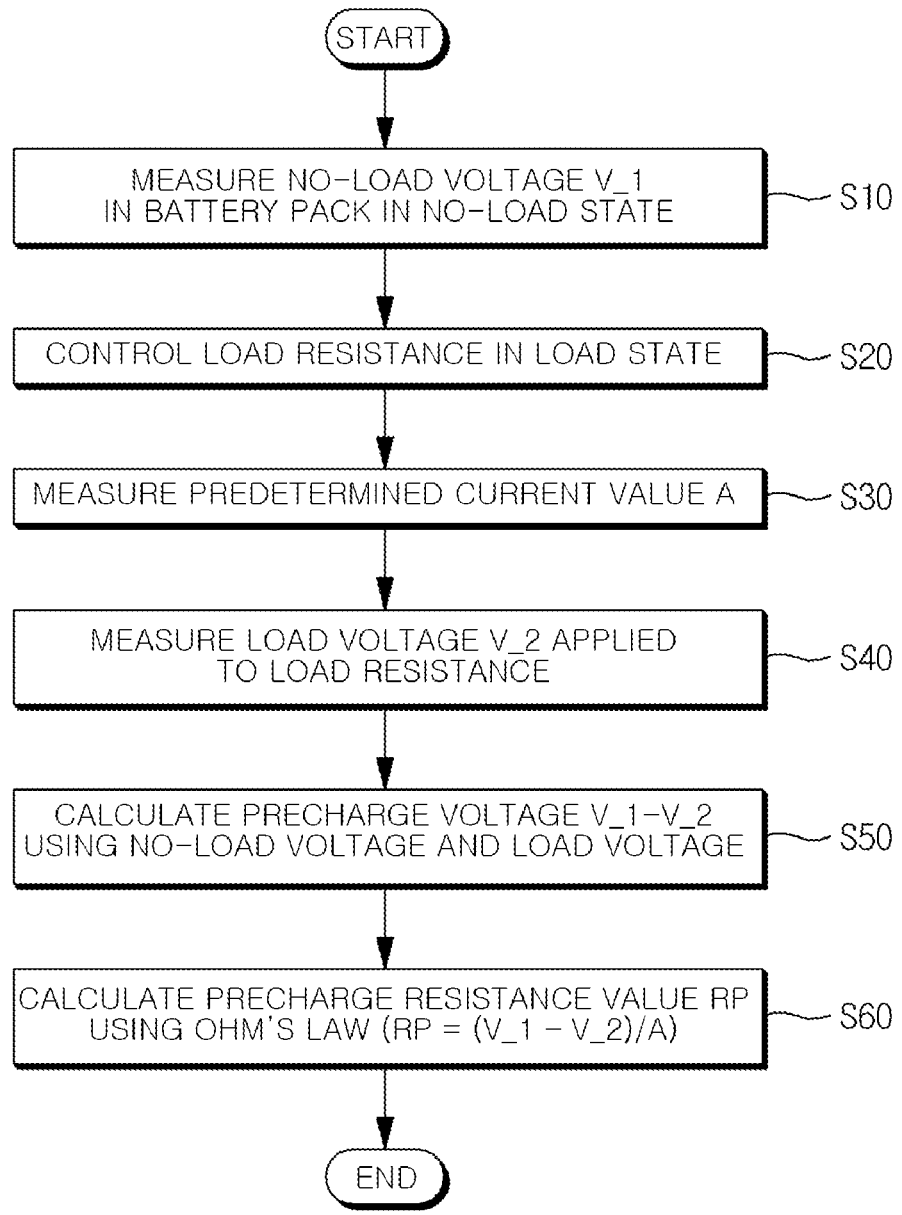
FIG. 6 is a flow chart illustrating a method for calculating a precharge resistance of a battery pack according to the exemplary embodiment of the present invention.

FIG. 6 is a flow chart illustrating a method for calculating a precharge resistance of a battery pack according to the exemplary embodiment of the present invention.

Referring to FIG. 6, when the method for calculating a precharge resistance of a battery pack according to the exemplary embodiment of the present invention starts, the no-load voltage V_1 in the battery pack is measured in the no-load state (S10). Further, the load resistor is controlled in the load state (S20). Step S20 is a step which may be performed in the load resistor 110 of the battery pack illustrated in FIG. 3, and since the description of the load resistor 110 is applied hereto, the overlapping description thereof will be omitted.

Next, when the current is applied in the load state by the current measuring unit and the current value becomes a predetermined current value, the current value is measured (S30). Step S30 is a step which may be performed by the current measuring unit 130 of the battery pack illustrated in FIG. 3, and since the description of the current measuring unit 130 is applied hereto, the overlapping description thereof will be omitted.

Next, when the measured current becomes the predetermined current value, the load voltage applied to the load resistor is measured (S40). Step S10 or S40 is a step which may be performed by the voltage measuring unit 120 of the battery pack illustrated in FIG. 3, and since the description of the voltage measuring unit 120 is applied hereto, the overlapping description thereof will be omitted.

Further, the precharge voltage is calculated using the measured no-load voltage and load voltage (S50).

Next, the precharge resistance value is calculated using the ohm's law (S60). Steps S50 and S60 are steps which may be performed by the precharge resistance calculating unit 150 of the battery pack illustrated in FIG. 3, and since the description of the precharge resistance calculating unit 150 is applied hereto, the overlapping description thereof will be omitted.

The aforementioned method for calculating a precharge resistance of a battery pack has been described with reference to a flow chart illustrated in the drawings. For a simple description, the method is illustrated and described in a series of blocks, but the present invention is not limited to an order of the blocks, some blocks may be generated simultaneously with or in an order different from other blocks and ones illustrated and described in the present specification, and other various branches, a flow path, and an order of the blocks which achieve the same or similar results may be implemented. Further, all the blocks illustrated to implement the method described in the present specification may not be required.

Although specific exemplary embodiments of the present invention have been described as above and illustrated in the drawings, the technical spirit of the present invention is not limited to the accompanying drawings and the contents described above, it is obvious to those skilled in the art that the present invention can be modified and changed in various forms without departing from the spirit of the present invention, and it should be interpreted that all the equivalents to the present invention are included in the claims of the present invention without departing from the spirit of the present invention.

The invention claimed is:

1. An apparatus for calculating a precharge resistance of a battery pack, comprising:
   a load resistor configured to be connected between a battery pack and a precharge resistor in series;
   a voltage measuring unit configured to measure a no-load voltage in a no-load state in which the load resistor is not installed in the battery pack or a load voltage applied to the load resistor when a current having a predetermined current value flows in the load resistor in a load state in which the load resistor is installed in the battery pack; and
   a precharge resistance calculating unit configured to calculate a resistance value of a precharge resistor of the battery pack using the no-load voltage of the battery pack, the load voltage, and the predetermined current value.

2. The apparatus of claim 1, wherein the no-load voltage is an open circuit voltage (OCV) of the battery pack.

3. The apparatus of claim 1, wherein the load resistor is a variable resistor which controls a resistance value to adjust a current value of the current flowing in the load resistor.

4. The apparatus of claim 1, wherein the precharge resistance calculating unit gradually increases the resistance value of the load resistor from 0 ohm in the load state to control the current flowing in the load resistor to have the predetermined current value.

5. The apparatus of claim 4, wherein the predetermined current value is 1 A.

6. The apparatus of claim 1, further comprising:
   a current measuring unit disposed between the battery pack and the load resistor or between the load resistor and the precharge resistor and configured to measure a current.

7. The apparatus of claim 6, wherein the current measuring unit is a current sensor.

8. The apparatus of claim 1, further comprising:
a switch control unit connected to the battery pack in series and configured to control a switch performing an opening and closing operation of a line provided with the precharge resistor.

9. The apparatus of claim 8, wherein the switch control unit performs an operation of closing the switch so as to measure the no-load voltage or the load voltage in the no-load state or the load state.

10. The apparatus of claim 8, wherein the switch is a precharge relay switch.

11. The apparatus of claim 1, wherein the precharge resistance calculating unit calculates the resistance value of the precharge resistor based on the following Equation:

$$Rp=(V\_1-V\_2)/A \qquad \text{[Equation]}$$

where Rp represents the precharge resistance, V_1 represents the no-load voltage, V_2 represents the load voltage, and A represents the predetermined current value.

12. A method for calculating a precharge resistance of a battery pack, comprising:
measuring a no-load voltage in a no-load state in which the load resistor is not installed in the battery pack or a load voltage applied to the load resistor when a current having a predetermined current value flows in the load resistor in a load state in which the load resistor is installed in the battery pack; and
calculating a resistance value of the precharge resistor of the battery pack using the no-load voltage of the battery pack, the load voltage, and the predetermined current value.

13. The method of claim 12, wherein the no-load voltage is an open circuit voltage (OCV) of the battery pack.

14. The method of claim 12, further comprising:
controlling a resistance value to adjust a current value of the current flowing in the load resistor.

15. The method of claim 14, wherein in the calculating, the resistance value of the load resistor is gradually increased from 0 ohm in the load state to control the current flowing in the load resistor to have the predetermined current value.

16. The method of claim 15, wherein the predetermined current value is 1 A.

17. The method of claim 12, further comprising:
measuring a current between the battery pack and the load resistor or between the load resistor and the precharge resistor.

18. The method of claim 12, further comprising:
controlling a switch which is connected to the battery pack in series and performs an opening and closing operation of a line provided with the precharge resistor.

19. The method of claim 18, wherein in the controlling of the switch, an operation of closing the switch is performed so as to measure the no-load voltage or the load voltage in the no-load state or the load state of the battery.

20. The method of claim 12, wherein in the calculating, the precharge resistance is calculated based on the following Equation:

$$Rp=(V\_1-V\_2)/1A \qquad \text{[Equation]}$$

where Rp represents the precharge resistance, V_1 represents the no-load voltage, V_2 represents the load voltage, and A represents the predetermined current value.

* * * * *